(12) United States Patent
Duffy

(10) Patent No.: US 10,539,612 B2
(45) Date of Patent: Jan. 21, 2020

(54) VOLTAGE CONTRAST BASED FAULT AND DEFECT INFERENCE IN LOGIC CHIPS

(71) Applicant: KLA-Tencor Corporation, Milpitas, CA (US)

(72) Inventor: Brian Duffy, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 715 days.

(21) Appl. No.: 15/136,680

(22) Filed: Apr. 22, 2016

(65) Prior Publication Data

US 2016/0341791 A1    Nov. 24, 2016

Related U.S. Application Data

(60) Provisional application No. 62/164,081, filed on May 20, 2015.

(51) Int. Cl.
*G01R 31/305* (2006.01)
*G01R 31/307* (2006.01)

(52) U.S. Cl.
CPC ......... *G01R 31/305* (2013.01); *G01R 31/307* (2013.01)

(58) Field of Classification Search
CPC ............................ G01R 31/04; G01R 31/2653; G01R 31/2884; G01R 31/305; G01R 31/307; G01R 31/311
See application file for complete search history.

(56) References Cited

U.S. PATENT DOCUMENTS

| | | | |
|---|---|---|---|
| 6,154,714 | A | 11/2000 | Lepejian |
| 6,529,621 | B1 | 3/2003 | Glasser et al. |
| 6,545,491 | B2 | 4/2003 | Kim et al. |
| 6,691,052 | B1 | 2/2004 | Maurer |
| 6,748,103 | B2 | 6/2004 | Glasser et al. |
| 6,920,596 | B2 | 7/2005 | Sagatelian et al. |
| 6,921,672 | B2 | 7/2005 | Satya et al. |
| 6,930,309 | B1 | 8/2005 | Mankos et al. |
| 6,948,141 | B1 | 9/2005 | Satya et al. |
| 6,966,047 | B1 | 11/2005 | Glasser |

(Continued)

FOREIGN PATENT DOCUMENTS

| | | |
|---|---|---|
| CN | 1677636 A | 10/2005 |
| CN | 1877292 A | 12/2006 |

(Continued)

OTHER PUBLICATIONS

PCT Search Report for Application No. PCT/US2016/032925 dated Aug. 29, 2016, 3 pages.

(Continued)

*Primary Examiner* — Tung X Nguyen
(74) *Attorney, Agent, or Firm* — Suiter Swantz pc llo

(57) ABSTRACT

A voltage contrast imaging defect detection system includes a voltage contrast imaging tool and a controller coupled to the voltage contrast imaging tool. The controller is configured to generate one or more voltage contrast imaging metrics for one or more structures on a sample, determine one or more target areas on the sample based on the one or more voltage contrast imaging metrics, receive a voltage contrast imaging dataset for the one or more target areas on the sample from the voltage contrast imaging tool, and detect one or more defects based on the voltage contrast imaging dataset.

38 Claims, 3 Drawing Sheets

(56) References Cited

U.S. PATENT DOCUMENTS

| | | |
|---|---|---|
| 6,995,393 B2 | 2/2006 | Weiner et al. |
| 7,676,077 B2 | 3/2010 | Kulkarni et al. |
| 8,112,241 B2 | 2/2012 | Xiong |
| 8,126,255 B2 | 2/2012 | Bhaskar et al. |
| 8,194,968 B2 | 6/2012 | Park et al. |
| 8,611,639 B2 | 12/2013 | Kulkarni et al. |
| 2007/0222464 A1* | 9/2007 | Honda ............... G01R 31/307 324/754.22 |
| 2007/0296447 A1 | 12/2007 | Bae et al. |
| 2008/0167829 A1 | 7/2008 | Park et al. |
| 2009/0058437 A1 | 3/2009 | Honda et al. |
| 2011/0080180 A1 | 4/2011 | Lavoie et al. |
| 2011/0278452 A1* | 11/2011 | Nozoe ............... H01J 37/244 250/307 |
| 2015/0039954 A1 | 2/2015 | Kekare |

FOREIGN PATENT DOCUMENTS

| | | |
|---|---|---|
| CN | 103688333 A | 3/2014 |
| CN | 104237719 A | 12/2014 |
| WO | 2016014714 A1 | 1/2016 |

OTHER PUBLICATIONS

Alvin Jee et al., Carafe: An Inductive Fault Analysis Tool for SMOS VLSI Circuits, Eleventh Annual VLSI Test Symposium Digest of Papers, Apr. 1993, pp. 92-98, IEEE.

Z. Stanojevic et al., Defect localization using physical design and electrical test information, Advanced Semiconductor Manufacturing Conference and Workshop, Sep. 2000, pp. 108-115, IEEE.

Office Action dated Oct. 9, 2019 for Chinese Patent Application No. 201680025510.1.

\* cited by examiner

VOLTAGE CONTRAST BASED FAULT AND DEFECT INFERENCE IN LOGIC CHIPS

CROSS-REFERENCE TO RELATED APPLICATION

The present application claims the benefit under 35 U.S.C. § 119(e) of U.S. Provisional Application Ser. No. 62/164,081, filed May 20, 2015, entitled METHODS AND APPARATUS FOR VOLTAGE CONTRAST BASED FAULT AND DEFECT INFERENCE IN RANDOM LOGIC PRODUCT CHIPS, naming Brian Duffy as inventor, which is incorporated herein by reference in the entirety.

TECHNICAL FIELD

The present disclosure generally relates to defect detection, and, more particularly, to targeted defect detection using voltage contrast imaging.

BACKGROUND

Inspection systems identify and classify defects on semiconductor wafers to generate a defect population on a wafer. A given semiconductor wafer may include hundreds of chips, each chip containing thousands of components of interest, and each component of interest may have millions of instances on a given layer of a chip. As a result, inspection systems may generate vast numbers of data points (e.g. hundreds of billions of data points for some systems) on a given wafer. Further, the demand for ever-shrinking devices leads to increased demands on inspection systems. The demands include the need for increased resolution and capacity necessary to infer the root causes of identified defects without sacrificing inspection speed or accuracy. Therefore, it would be desirable to provide a system and method for curing shortcomings such as those identified above.

SUMMARY

A voltage contrast imaging defect detection system is disclosed in accordance with one or more illustrative embodiments of the present disclosure. In one illustrative embodiment, the system includes a voltage contrast imaging tool. In another illustrative embodiment, the system includes a controller coupled to the voltage contrast imaging tool, wherein the controller includes one or more processors. In another illustrative embodiment, the one or more processors are configured to execute program instructions configured to cause the one or more processors to generate one or more voltage contrast imaging metrics for one or more structures on a sample. In another illustrative embodiment, the one or more processors are configured to execute program instructions configured to cause the one or more processors to determine one or more target areas on the sample based on the one or more voltage contrast imaging metrics. In another illustrative embodiment, the one or more processors are configured to execute program instructions configured to cause the one or more processors to receive a voltage contrast imaging dataset for the one or more target areas on the sample from the voltage contrast imaging tool. In another illustrative embodiment, the one or more processors are configured to execute program instructions configured to cause the one or more processors to detect one or more defects based on the voltage contrast imaging dataset.

A voltage contrast imaging defect detection apparatus is disclosed, in accordance with one or more illustrative embodiments of the present disclosure. In one illustrative embodiment, the apparatus includes a particle beam source configured to generate one or more particle beams. In another illustrative embodiment, the apparatus includes one or more particle beam elements positioned to direct the one or more particle beams onto a sample. In another illustrative embodiment, the apparatus includes a detector positioned to receive one or more particles emanating from the sample. In another illustrative embodiment, the apparatus includes a controller coupled to the detector. In another illustrative embodiment, the controller includes one or more processors. In another illustrative embodiment, the one or more processors are configured to execute program instructions configured to cause the one or more processors to generate one or more voltage contrast imaging metrics for one or more structures on a sample. In another illustrative embodiment, the one or more processors are configured to execute program instructions configured to cause the one or more processors to determine one or more target areas on the sample based on the one or more voltage contrast imaging metrics. In another illustrative embodiment, the one or more processors are configured to execute program instructions configured to cause the one or more processors to generate a voltage contrast imaging dataset for the one or more target areas on the sample based on one or more particles emanating from the sample captured by the detector. In another illustrative embodiment, the one or more processors are configured to execute program instructions configured to cause the one or more processors to detect one or more defects based on the voltage contrast imaging dataset.

A voltage contrast imaging method for detecting defects on a sample is disclosed in accordance with one or more illustrative embodiments of the present disclosure. In one illustrative embodiment, the method includes generating one or more voltage contrast imaging metrics for one or more structures on a sample. In another illustrative embodiment, the method includes determining one or more target areas on a sample. In another illustrative embodiment, the method includes exposing the sample to one or more particle beams. In another illustrative embodiment, the method includes detecting one or more particles emanating from the sample in response to exposure to the particle beam. In another illustrative embodiment, the method includes generating a voltage contrast imaging dataset for the one or more target areas on the sample based on the one or more detected particles. In another illustrative embodiment, the method includes detecting one or more defects based on the voltage contrast imaging dataset.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
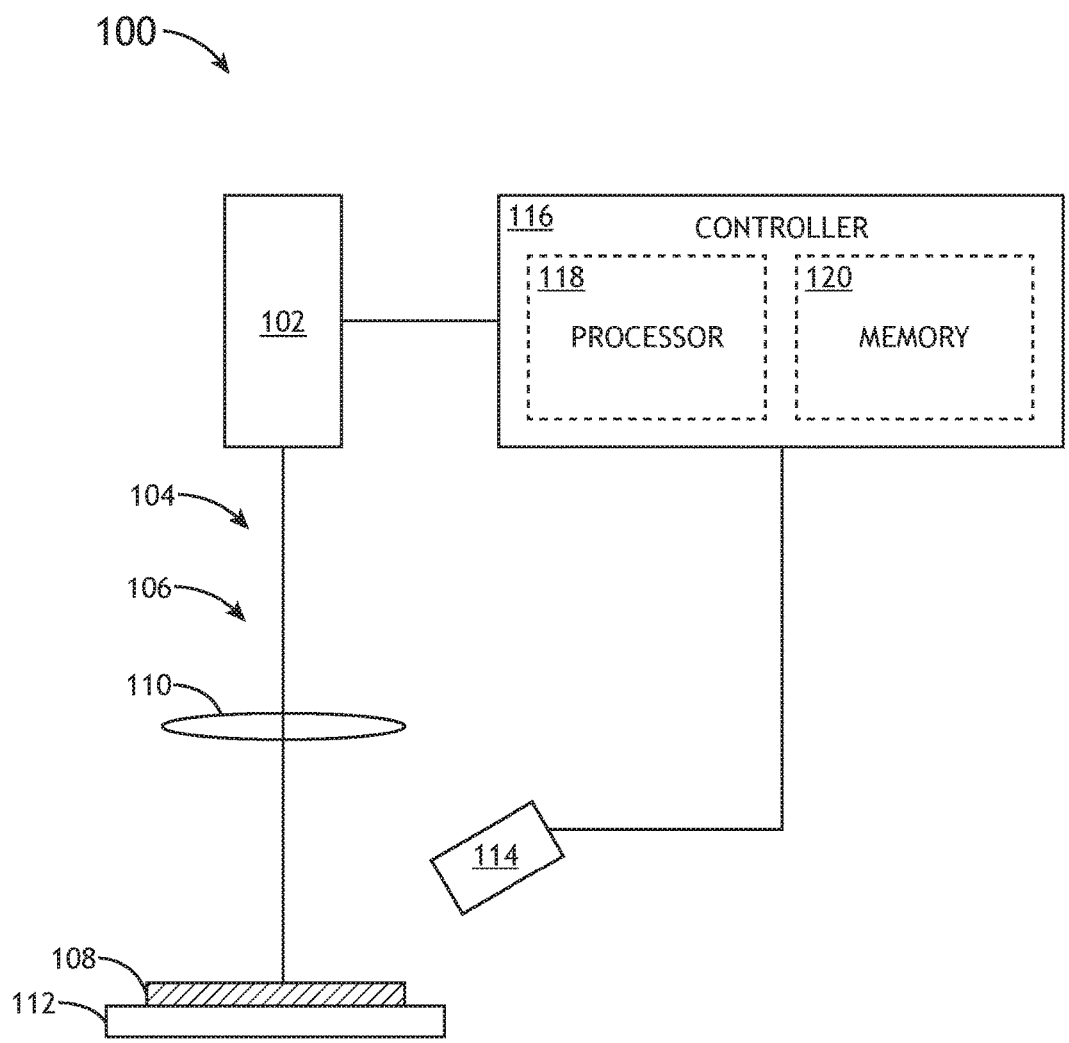
FIG. 1 is a simplified schematic view of an inspection system, in accordance with one or more embodiments of the present disclosure.
Figure 2:
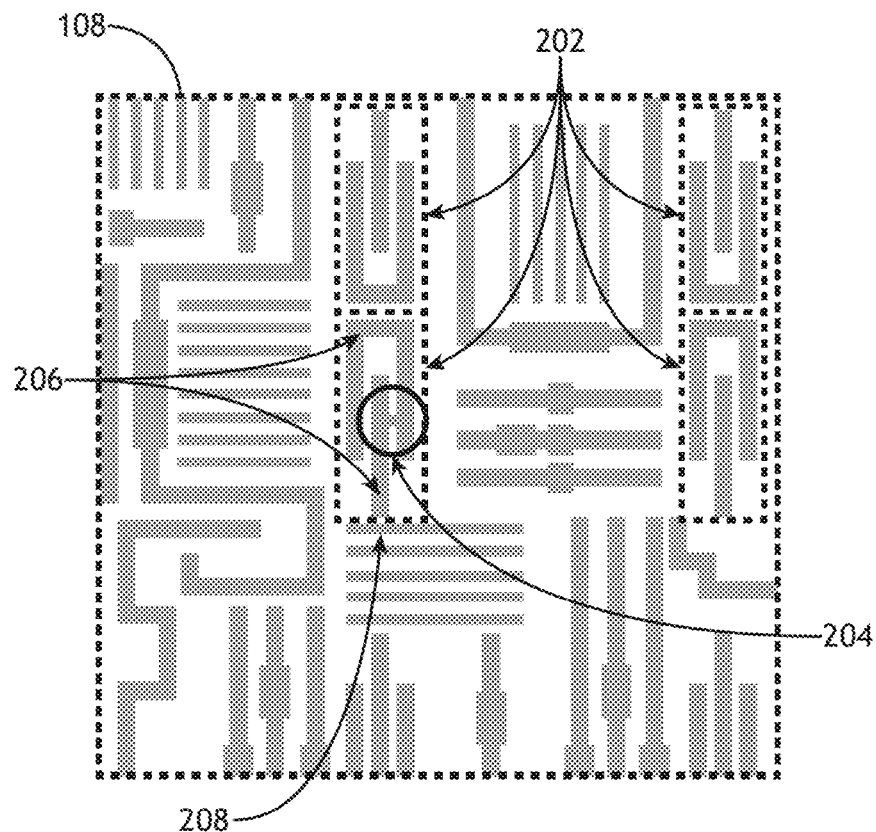
FIG. 2 is a conceptual diagram of target areas for inspection, in accordance with one or more embodiments of the present disclosure.
Figure 3:
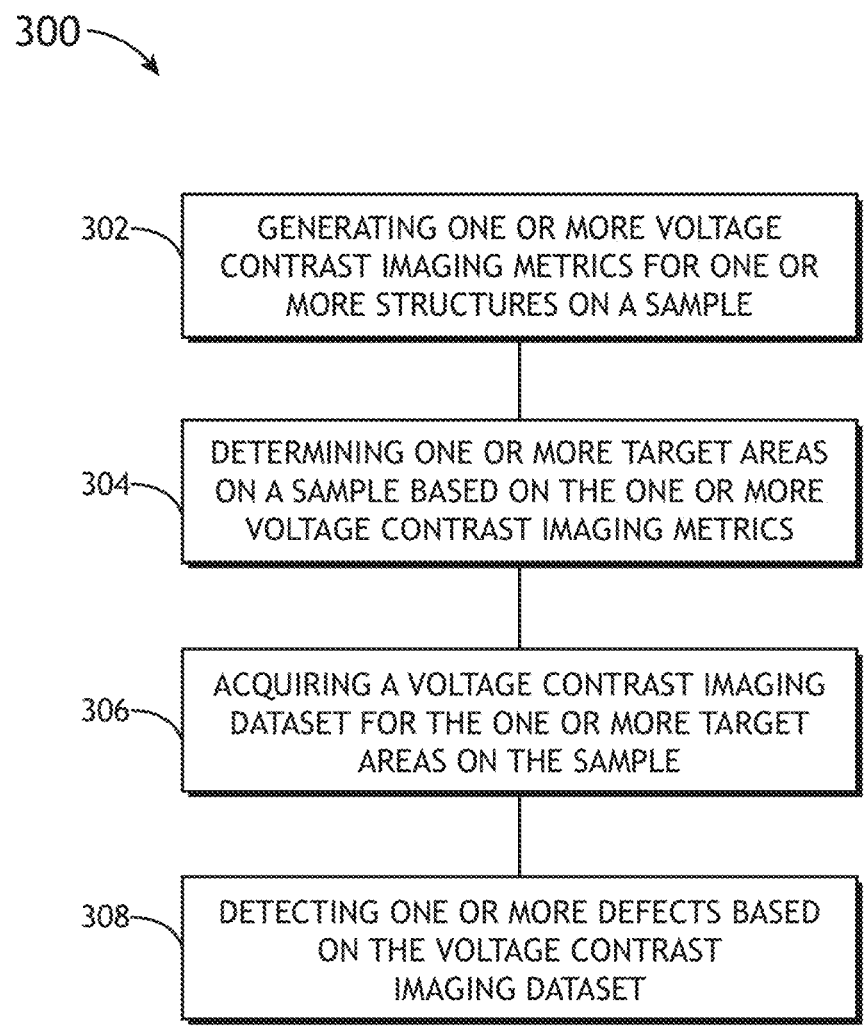
FIG. 3 is a flow diagram illustrating a method for defect inspection, in accordance with one or more embodiments of the present disclosure.

Referring generally to FIGS. 1 through 3, a system and method for detecting defects is described, in accordance with one or more embodiments of the present disclosure. Embodiments of the present disclosure are directed to detecting defects using voltage contrast imaging. Additional embodiments of the present disclosure are directed to generating one or more voltage contrast imaging metrics associated with components on a sample. Additional embodiments of the present disclosure are directed to determining one or more target areas on a sample to inspect based on the one or more voltage contrast imaging metrics. Additional embodiments of the present disclosure are directed to acquiring voltage contrast imaging datasets for the one or more target areas of the sample. Further embodiments of the present disclosure are directed to detecting defects on the sample based on the voltage contrast imaging datasets for the one or more target areas of the sample. Further embodiments of the present disclosure are directed to inferring defect mechanisms and/or fault mechanisms associated with the detected defects on the sample.

It is recognized herein that inspection systems utilizing particle beams (e.g. electron beams, ion beams, or the like) may be particularly useful for detecting and/or identifying defect mechanisms on a semiconductor sample (e.g. a random logic chip, or the like) due to a high achievable spatial resolution. For example, particle beams may be utilized within an inspection system to image a sample (e.g. by capturing secondary electrons, backscattered electrons, or the like emanating from the sample). Additionally, structures on a sample (e.g. a patterned semiconductor wafer) may exhibit charging effects in response to excitation with a particle beam. Charging effects may include a modification of the number of electrons (e.g. secondary electrons) captured by the system and thus the VCI signal strength. In this regard, a voltage contrast imaging (VCI) system may generate a high-resolution image of a sample in which the intensity of each pixel of the image provides data on the electrical properties of the sample at the pixel location. For example, insulating structures and/or structures that are not connected to a ground source (e.g. are not grounded) may develop a charge (e.g. a positive charge or a negative charge) in response to depletion of particles (e.g. secondary electrons, ions, or the like) induced by the particle beam. Accordingly the induced charge may deflect the trajectories of secondary electrons and reduce the signal intensity captured by a detector. Conversely, grounded structures may not develop a charge and therefore may exhibit a strong signal (e.g. appear bright in an associated VCI image). Further, the signal strength of capacitive structures may be a function of the scan speed and/or the energy of the particle beam. In this regard, a VCI image may include a grayscale image in which the grayscale value of each pixel provides data on the relative electrical characteristics of that location on the wafer.

Accordingly, VCI may be utilized to detect defects associated with a sample. For example, defects in a sample die may be characterized by comparing a VCI image of the sample die with a VCI image of a reference die (e.g. die-to-die (D2D) inspection, standard reference die (SRD) inspection, or the like) or by comparing a VCI image of the sample die with an image based on design characteristics (e.g. die-to-database (D2DB) inspection). Inspection systems using persistent data (e.g. stored data) is generally described in U.S. Pat. No. 8,126,255, issued on Feb. 28, 2012, which is incorporated herein by reference in its entirety. Inspection systems using design data of a sample to facilitate inspection is generally described in U.S. Pat. No. 7,676,077, issued on Mar. 9, 2010, and U.S. Pat. No. 6,154,714, issued on Nov. 28, 2000, which are incorporated herein by reference in their entirety. The determination of defect and fault sources are generally described in U.S. Pat. No. 6,920,596, issued on Jul. 19, 2005, U.S. Pat. No. 8,194,968, issued on Jun. 5, 2015, and U.S. Pat. No. 6,995,393, issued on Feb. 7, 2006, which are incorporated herein by reference in their entirety. Device property extraction and monitoring is generally described in U.S. Pat. No. 8,611,639, issued on Dec. 17, 2013. The use of dual-energy electron flooding for neutralization of a charged substrate is generally described in U.S. Pat. No. 6,930,309, issued on Aug. 16, 2005, which is incorporated herein by reference in its entirety. The use of reticles in inspection systems is generally described in U.S. Pat. No. 6,529,621, issued on Mar. 4, 2003, U.S. Pat. No. 6,748,103, issued on Jun. 8, 2004, and U.S. Pat. No. 6,966,047, issued on Nov. 15, 2005, which are incorporated herein by reference in their entirety. Generating an inspection process or inspection target is generally described in U.S. Pat. No. 6,691,052, issued on Feb. 10, 2004, U.S. Pat. No. 6,921,672, issued on Jul. 26, 2005, and U.S. Pat. No. 8,112,241, issued on Feb. 7, 2012, which are incorporated herein by reference in their entirety. Determination of critical areas of semiconductor design data is generally described in U.S. Pat. No. 6,948,141, issued on Sep. 20, 2005, which is incorporated by reference herein in its entirety.

Embodiments of the present disclosure are directed to performing efficient VCI defect inspection by limiting the generating VCI data to specified target areas of interest on a sample. Target areas may be determined based on a multitude of criteria such as, but not limited to structure size and/or spacing, structure complexity, predicted VCI signal strength, predicted fault mechanism, or predicted defect types. In this regard, both the speed and accuracy of VCI defect inspection may be tuned according to design and/or inspection requirements. For example, limiting VCI inspection to target areas of a sample rather than the entire sample may increase the throughput of VCI data generation. It is noted herein that particle beam-based inspection (e.g. VCI inspection, scanning electron imaging inspection, focused ion beam inspection, and the like) may be time-intensive and may present a bottleneck to a semiconductor fabrication. Further, performing VCI inspection on target areas of a sample including well-characterized structures with highly predictable VCI signals may improve the accuracy of defect detection (e.g. by reducing false-positives, by providing an increase in actionable data associated with a semiconductor process, or the like). In some embodiments, targeted areas are determined based on design data such as, but not limited to, the intended size, shape, orientation, or electrical characteristics of structures on the wafer. For example, a target area may include closely-spaced structures for which an increased likelihood for reliable detection of probable defects exists (e.g. electrical shorts associated with bridge defects between structures, or the like). In contrast, target areas may be designed to intentionally exclude complex circuits or structures (e.g. many-layer structures) that may be difficult to inspect (e.g. difficult to identify defects and/or determine root causes of identified defects) using VCI inspection techniques. In some embodiments, targeted areas are determined based on a predicted failure mechanism associated with a known structure type (e.g. to analyze one or more root causes of the predicted failure mechanism).

FIG. 1 is a simplified schematic view of a voltage contrast imaging inspection system, in accordance with one or more embodiments of the present disclosure. In one embodiment, the system 100 includes a particle source 102 configured to generate a particle beam 104. The electron source 102 may include any particle source known in the art suitable for generating a particle beam 104. By way of non-limiting example, the particle source 102 may include, but is not limited to, an electron gun or an ion gun. In another embodiment, the particle source 102 is configured to provide a particle beam 104 with a tunable energy. For example, a particle source 102 including an electron source may, but is not limited to, provide an accelerating voltage in the range of 0.1 kV to 30 kV. As another example, a particle source including an ion source may, but is not required to, provide an ion beam with an energy in the range of 1 to 50 keV.

In another embodiment, the system 100 includes an inspection sub-system 106 to direct the particle beam 104 to a sample 108. In one embodiment, the inspection sub-system 106 includes one or more particle focusing elements 110. For example, the one or more particle focusing elements 110 may include, but are not limited to, a single particle focusing element or one or more particle focusing elements forming a compound system. In another embodiment, the one or more particle focusing elements 110 include an objective lens configured to direct the particle beam 104 to the sample 108. Further, the one or more particle focusing elements 110 may include any type of electron lenses known in the art including, but not limited to, electrostatic, magnetic, unipotential, or double-potential lenses. It is noted herein that the description of a voltage contrast imaging inspection system as depicted in FIG. 1 and the associated descriptions above are provided solely for illustrative purposes and should not be interpreted as limiting. For example, the system 100 may include any excitation source known in the art suitable for generating voltage contrast imaging inspection data on a sample 108. In another embodiment, the system 100 includes two or more particle beam sources (e.g. electron beam sources or ion beam sources) for the generation of two or more particle beams. In a further embodiment, the system 100 may include one or more components (e.g. one or more electrodes) configured to apply one or more voltages to one or more locations of the sample 108. In this regard, the system 100 may generate active voltage contrast imaging data.

In another embodiment, the inspection sub-system includes a detector 114 to image or otherwise detect particles emanating from the sample 108. In one embodiment, the detector 114 includes an electron collector (e.g., a secondary electron collector, a backscattered electron detector, or the like). In another embodiment, the detector 114 includes a photon detector (e.g., a photodetector, an x-ray detector, a scintillating element coupled to photomultiplier tube (PMT) detector, or the like) for detecting electrons and/or photons from the sample surface.

In another embodiment, the system 100 includes a controller 116 communicatively coupled to the detector assembly 114. For example, the controller 116 may be configured to receive one or more signals from the detector assembly to generate an image (e.g. a VCI image) of the sample 108. In another embodiment, the controller 116 is communicatively coupled to the sample stage 112. In this regard, the controller 116 may direct and/or receive the position of the sample stage such that the one or more signals received from the detector assembly 114 may be correlated with the position of the sample. In another embodiment, the controller 116 is communicatively coupled with the electron source 102. For example, the controller 116 may be communicatively coupled to the electron source 102 to control the energy of the particle beam 104. As another example, the controller 116 may be communicatively coupled to the electron source 102 and/or the inspection sub-assembly 106 (e.g. one or more beam deflectors in the inspection sub-assembly 106) to direct and/or receive the position of the particle beam 104 with respect to the sample 108. In this regard, the controller 116 may generate an image (e.g. a VCI image) utilizing the one or more signals from the detector assembly 114 as the particle beam 104 is scanned across the sample 108.

In another embodiment, the controller 116 is configured to identify one or more defects on the sample 108 based on the one or more signals received from the detector assembly 114. Identifiable defects may include, but are not limited to, physical defects (e.g. a bridge defect improperly connecting two structures, a gap defect indicating a weak or nonexistent connection between structures, peeling or improper contact between materials within the structures, or the like), electrical defects (e.g. variations in a resistance, capacitance, bandgap, or the like), or a combination thereof. For example, physical defects may induce a modification of the electrical properties of one or more structures from an expected value (e.g. a bridge defect between conducting structures may modify the function of the associated electrical circuit, a gap defect may electrically isolate one or more structures, or the like). Further, defects may be located on the surface or within one or more layers of a multilayer structure (e.g. a patterned semiconductor device including patterned layers of insulating, conducting, and/or semiconducting materials).

For example, the controller 116 may identify one or more defects using any method known in the art including, but not limited to a die-to-die (D2D) inspection technique, a standard reference die (SRD) inspection technique, a die-to-database (D2DB) inspection technique, a template-based inspection (TBI) technique, or a context-based inspection (CBI) technique. In another embodiment, the controller 116 may operate as a virtual inspector. In this regard, the controller 116 may detect one or more defects on the sample 108 by comparing VCI data of the sample (e.g. collected by the detector 114) to persistent reference data (e.g. one or more reference images). For example, the reference image may be stored in a data storage system (e.g. a database, a server, or the like) and utilized for defect detection. In another embodiment, the controller 116 generates and/or receives a simulated VCI image based on design data associated with the sample 108 to operate as a reference image for defect detection. Accordingly, the controller 116 may perform D2DB inspection by comparing VCI data of the sample 108 to the reference image.

In one embodiment, the controller 116 identifies one or more defects on the sample 108 by generating VCI data (e.g. one or more VCI images) of the sample 108 and comparing the VCI data to corresponding reference data. In another embodiment, the controller 116 utilizes design data to facilitate inspection. For example, design data may include characteristics of individual components and/or layers on the sample 108 (e.g. an insulator, a conductor, a semiconductor, a well, a substrate, or the like), a connectivity relationship between layers on the sample 108, or a physical layout of components and connections (e.g. wires) on the sample 108. As another example, design data may include a description of the connectivity of components within an electrical circuit (e.g. netlist data, circuit simulation data, hardware description language data, or the like). In this regard, the intended functionality of a sample 108 (e.g. the intended functionality of a logic circuit patterned on a semiconductor wafer, or the like) may provide context for the interpretation of VCI data.

In one embodiment, design data utilized to facilitate inspection (e.g. by the controller 116) includes one or more netlists. Netlists may include any type of netlist known in the art for providing a description of the connectivity of an electrical circuit including, but not limited to physical netlists, logical netlists, instance-based netlists, or net-based netlists. Further, a netlist may include one or more sub-netlists (e.g. in a hierarchal configuration) to describe circuits and/or sub-circuits on a sample 108. For example, netlist data associated with a netlist may include, but is not limited to, a list of nodes (e.g. nets, wires between components of a circuit, or the like), a list of ports (e.g. terminals, pins, connectors, or the like), a description of electrical components between the nets, (e.g. resistor, capacitor, inductor, transistor, diode, power source, or the like), values associated with the electrical components (e.g. a resistance value in ohms of a resistor, a voltage value in volts of a power source, frequency characteristics of a voltage source, initial conditions of components, or the like). In another embodiment, design data may include one or more netlists associated with specific steps of a semiconductor process flow. For example, a sample 108 may be inspected (e.g. by system 100) at one or more intermediate points in a semiconductor process flow. Accordingly, design data utilized to facilitate inspection may be specific to the layout of the sample 108 at a current point in the semiconductor process flow. In this regard, a netlist associated with a particular intermediate point in a semiconductor process flow may be derived (e.g. extracted, or the like) from either the physical design layout in combination with a technology file (layer connectivity, electrical properties of each of the layers, and the like) or a netlist associated with a final layout of a sample 108 to include only components present on the wafer at the particular intermediate point in the semiconductor process flow.

In another embodiment, the controller 116 identifies one or more root causes of defects (e.g. a defect mechanism, or the like) of measured deviations between VCI data from the sample 108 and reference data. In another embodiment, the controller utilizes design data associated with structures on the sample (e.g. the designed size/shape of individual structures, the designed electrical connections between structures, and the like) to provide context for a root cause analysis. As one illustrative example, the controller 116 may utilize design data to determine a defect in the ground connection of an electrical contact on the sample 108. In doing so, the controller 116 may, but is not required to, determine that a grayscale value of a VCI image of a specified region on the sample 108 is darker (e.g. due to a reduced VCI signal) than a reference value indicating a larger than expected resistance to ground for the specified region. Further, the controller 116 may utilize design data indicating that the specified region is an electrical contact to identify a defect in the ground connection based on the reduced VCI signal.

It is recognized herein that the capability of a VCI inspection system (e.g. system 100) to determine a root cause of a measured deviation between VCI data from a sample 108 and reference data (e.g. the diagnostic resolution of the system) may depend on the physical characteristics of individual structures on the sample 108. Accordingly, a VCI system may be better suited to identify defects and/or determine a root cause of identified defects for some classes of structures or circuits than others. For example the diagnostic resolution may be influenced by, but is not required to be influenced by, a number of factors including, but not limited to, the number of layers on the sample 108, the size/spacing of individual structures (e.g. elements of a circuit patterned on the sample 108, support structures, or the like), the complexity of the circuit, the number of branches of the circuit (e.g. the fan-out), or the classes of elements in the circuit (e.g. resistors, capacitors, diodes, transistors, or the like). In this regard, the diagnostic resolution of the system 100 to detect and/or characterize defects located on the surface of a sample 108 may be higher than for defects located in a sub-surface layer. As another example, the diagnostic resolution of the system 100 to detect and/or characterize defects location on a relatively simple circuit (e.g. defects on elements with few paths to ground) may be higher than for defects on relatively complex circuits. Further, the diagnostic resolution of a VCI inspection system for certain structures may be dependent on inspection parameters (e.g. the energy of the particle beam, the scan speed of the particle beam, or the like). For example, a VCI signal strength of a capacitor may depend on the capacitance value and/or the charge stored within the capacitor. In this regard, the behavior of a capacitor is highly dependent on both the inspection parameters and the location within a circuit.

FIG. 2 is a conceptual diagram illustrating the definition of targeted inspection areas of a sample, in accordance with one or more embodiments of the present disclosure. In one embodiment, the system 100 determines one or more target areas 202 of interest on the sample 108 and selectively detects defects within the target areas 202 (e.g. the system does not detect defects on the entire sample 108). In this regard, the system 100 may provide targeted defect detection to meet one or more diagnostic objectives. For example, the system may limit defect detection to one or more target areas 202 of the sample 108 based on factors including, but not limited to, desired throughput, desired sensitivity, an allowable number of false positives and/or false negatives, a targeted analysis of one or more structure types of interest, a targeted analysis of one or more defect mechanisms of interest, a targeted analysis of one or more fault types of interest, complete coverage of elements within a cell, or the like.

For example, as shown in FIG. 2, the system 100 may define one or more target areas 202 to include components (e.g. circuits, sub-circuits, individual electrical components, physical structures, or the like) that are well-suited for accurate root cause determination of associated defects using voltage contrast imaging. In this regard, defects (e.g. bridge defect 204) may be accurately detected. Further, the definition of the one or more target areas 202 may reduce the impact of VCI signals associated with structures outside of the target areas 202. In one embodiment, the contrast of VCI images generated from a selected target area (e.g. one of target areas 202) is based only the VCI signals associated with components 206 within the selected target areas 202. In the case that the selected target areas 202 contain well-characterized signals, the associated VCI image may have a high dynamic range suitable for sensitive inspection. In another embodiment, performing inspection (e.g. by the controller 116) only on target areas 202 may minimize unwanted charging of adjacent components 208 that may influence the VCI signal of structures within the target areas 202. For example, defining a target area 202 to exclude capacitors with high capacitance values may reduce charging of the capacitors and accordingly reduce spurious charging effects (e.g. associated with capacitor discharge) on structures of interest.

As another illustrative example, the controller 116 may utilize design data (e.g. netlist data, physical layout data, and the like) to facilitate the determination of a root cause (e.g. infer a defect mechanism) associated with defects identified in the one or more target areas 202. As an illustrative example, a bridge defect inducing an electrical short for a selected component of the sample 108 may result in a higher than expected (e.g. relative to reference data) VCI signal for the selected component. Such a deviation of VCI data may potentially be associated with any of multiple defect mechanisms (e.g. an isolated defect in a sublayer of the selected structure, a fault associated with a connected component, a short to a proximate structure, or the like). The controller 116 may utilize design data (e.g. netlist data, physical layout data, or the like) to identify the physical and/or electrical properties of neighboring structures to provide context for the interpretation of the higher than expected VCI signal. In this regard, the controller 116 may identify an electrically grounded neighboring structure in close proximity to the selected component. Further, the controller 116 may generate a list of probable defect mechanisms (e.g. by assigning a probability to each of several possible defect mechanisms, or the like). Additionally, the controller 116 may utilize image data to further refine the list of probable defect mechanisms. For example, in this illustrative example, the controller 116 may utilize the combination of design data and image data to positively identify the bridge defect and the associated electrical short.

In another embodiment, the controller 116 determines one or more probable fault mechanisms associated with one or more identified defects. The controller 116 may determine probable fault mechanisms using any technique known in the art including, but not limited to fault modeling, fault injection, circuit simulation, or the like. For example, the controller 116 may determine a probability that one or more components will fail as a result of one or more identified defects. As another example, the controller 116 may correlate design data to identified defects (e.g. a number of identified defects, a fault probability, or the like). In this regard, the controller may determine a susceptibility of failure of one or more components (e.g. a physical layout of one or more components, a particular construction of an electrical component, or the like) based on the presence of defects within the target areas 202. Further, the controller 116 may identify one or more critical areas (e.g. through a critical area analysis) of the sample 108 based on the inspection of the one or more target areas 202. In one embodiment, the controller 116 determines one or more target areas 202 to selectively include components predicted to exhibit one or more expected defect mechanisms to provide a targeted identification of critical areas susceptible to the one or more expected defect mechanisms. Accordingly, the system 100 may provide data (e.g. a pareto of identified defects, probable defect mechanisms, probable failure mechanisms, or the like) as feedback data and/or feed-forward data. For example, the system 100 may provide feedback data to refine the design of the sample (e.g. to reduce and/or eliminate a susceptibility of failure associated with defects identified by the system 100). As another example, the system 100 may provide feedback data to refine the definition of target areas 202 and perform an updated VCI inspection analysis on the sample 108. As a further example, the system 100 may provide feed-forward data to additional tools (e.g. metrology tools, semiconductor process tools, and the like) to update and/or refine one or more recipes.

FIG. 3 is a flow diagram illustrating steps performed in a method 300 for detecting defects in a sample, in accordance with one or more embodiments of the present disclosure. Applicant notes that the embodiments and enabling technologies described previously herein in the context of system 100 should be interpreted to extend to method 300. It is further noted, however, that the method 300 is not limited to the architecture of system 100.

In one embodiment, step 302 includes generating one or more voltage contrast imaging metrics for one or more structures on the sample 108. For example, step 302 may include labeling components of the sample 108 (e.g. circuits, sub-circuits, individual electrical components, physical structures, or the like) according to one or more voltage contrast imaging metrics. The voltage contrast imaging metrics may include any metric suitable for characterizing an aspect of a VCI signal such as, but not limited to, a predicted VCI signal intensity (e.g. a predicted signal strength as measured by a detector 114, a predicted grayscale value of a reference VCI image, a simulated VCI signal strength, or the like), a predicted diagnostic resolution, a number of probable defect mechanisms, characteristics of electrical components (e.g. a capacitance value, or the like), a physical layout (e.g. spacing between neighboring structures, a number of layers on the sample 108, or the like), or required VCI conditions for sensitive analysis (e.g. a required energy of a particle beam, a required scan speed of a particle beam, a required acquisition time, or the like).

In another embodiment, the one or more voltage contrast imaging metrics include a predicted VCI signal strength for one or more components of the sample 108. For example, a predicted signal strength may be generated automatically (e.g. by the controller 116 of system 100 using one or more scripts, software modules, or the like), manually (e.g. through user input), or semi-automatically (e.g. by user-assisted predictions).

In another embodiment, predicted VCI signal strengths of components of the sample 108 are generated based on circuit simulations (e.g. numerical or rule-based estimates of VCI signals strength). For example, predicted VCI signals strengths may be simulated based on design data (e.g. netlist data provided by a user, automatically extracted using electronic design automation (EDA) tools, or the like). In this regard, the electrical components (e.g. resistors, capacitors, inductors, diodes, transistors, or the like) as well as the electrical connections between them (e.g. nets) may be extracted from one or more netlists associated with a sample 108 and labeled according to a simulated VCI signal strength. As an illustrative example, grounded electrical contacts may be labeled with a predicted relatively high VCI signal strength due to excess electrons provided by the ground connection will prevent charging and associated VCI signal degradation. As another illustrative example, a high resistance to ground (e.g. associated with a relatively high resistor, a floating device with a low capacitance, or the like) may be labeled with a predicted relatively low VCI signal strength. As a further illustrative embodiment, structures connected to leaky components (e.g. diodes, capacitors, or the like) may be labeled with a predicted medium-level VCI signal strength.

In another embodiment, VCI signal strengths are predicted based on the characteristics of one or more layers (e.g. one or more patterned layers) on the sample 108 (e.g. whether a layer is an insulator, a conductor, a semiconductor, or the like). Further, VCI signals strengths may be predicted based on connectivity between the one or more layers. It is noted that charging effects associated with sub-surface layers of a sample 108 may impact the VCI signal strength of the surface layer in direct interaction with the scanning particle beam. In this regard, both intrinsic characteristics of a given structure and the influence of connected structures may be reflected in a predicted VCI signal strength.

In another embodiment, predicted signal strengths may be provided (e.g. by the controller 116) numerically (e.g. as a list, a table, or the like) or graphically (e.g. as a simulated VCI image based on the physical layout of components on the sample 108 in which predicted VCI signal strengths are mapped to grayscale values of a simulated VCI image, or the like). Further, predicted VCI signals strengths may be relative values or absolute values. For example, relative predicted signals strengths may be scaled to match a dynamic range of measured VCI signals (e.g. as measured by a detector 114) from the sample 108.

In another embodiment, the one or more voltage contrast imaging metrics include a predicted diagnostic resolution of one or more components of the sample 108. In this regard, components of the sample 108 may be labeled according to the degree to which a VCI inspection system (e.g. system 100, or the like) may detect defects and/or identify the root causes of detected defects. In this regard, a predicted diagnostic resolution may, but is not required to, operate as a quality metric associated with the compatibility of a given component (e.g. a given circuit, a given sub-circuit, a given electrical component, a given net, or the like) with a VCI inspection system.

For example, a predicted diagnostic resolution may be, but is not required to be, based on a complexity of branches within a circuit (e.g. a fan-out of the circuit). In this regard, the number of branches within a circuit may be related to the number of available paths to ground for components within the circuit. Accordingly, the number of branches may impact the reliability (e.g. the uncertainty) of predicting VCI signal strength for one or more components within the circuit. Further, the predicted diagnostic resolution may be, but is not limited to be, based on the number of contacts and/or vias associated with a given node, which may affect the number of possible defect mechanisms.

As another example, a predicted diagnostic resolution may be, but is not required to be, based on the classes of structures located on the sample 108, such as, but not limited to, short interconnects (e.g. exhibiting relatively low resistance and capacitance) long interconnects (e.g. potentially high resistance and capacitance), resistors (e.g. N or P resistors), junctions, capacitors (e.g. gate capacitors, plate capacitors, or the like), diodes (e.g. P-N diodes, N-P diodes, or the like), transistors (N transistors, P transistors, bipolar transistors, field effect transistors (FETs), or the like), or interconnects between nets.

As a further example, a predicted diagnostic resolution may be, but is not limited to be, based on the physical layout of components on the sample 108. In this regard, the proximity of structures may influence the probability of electrical shorts between the structures (e.g. associated with bridge defects). Additionally, closely spaced structures may exhibit a parasitic capacitance during VCI imaging associated with charge buildup, which may complicate the prediction of VCI signal strengths.

In another embodiment, the one or more voltage contrast imaging metrics include a predicted defect mechanism associated with components on the sample 108. For example, the components of the sample 108 may be prone to predictable defect mechanisms such as, but not limited to, electrical shorts, open circuits, voids, impurities, peeling, pattern defects, or gate leakage effects. Similarly, in a further embodiment, the one or more voltage contrast imaging metrics include predicted fault mechanisms (e.g. associated with a circuit design, a probability of known defect mechanisms, or the like). Accordingly, the one or more voltage contrast metrics may be based on known or anticipated failure mechanisms associated with the construction or operation of a circuit.

In another embodiment, the components of the sample 108 are grouped (e.g. in a list, a table, an index, a file, a database, or the like) according to the voltage contrast imaging metrics. Further, any number of voltage contrast imaging metrics may be associated with each component of the sample 108.

In another embodiment, the one or more voltage contrast imaging metrics are based on VCI acquisition conditions such as, but not limited to, a required resolution (e.g. a resolution required to image a critical dimension), an energy of the particle beam, a scan speed of the particle beam, a required acquisition time, or a required operating pressure. For example, the VCI signal strength of capacitive elements (e.g. fabricated capacitors, structures including parasitic capacitances, or the like) may depend on the amount of charge stored in the capacitive element driven by VCI acquisition conditions.

In another embodiment, step 304 includes determining one or more target areas to be inspected based on the one or more voltage contrast imaging metrics. For example, a subset of the components of the sample 108 (e.g. circuits, sub-circuits, individual electrical components, physical structures, or the like) may be selected (e.g. by the controller 116 of the system 100, a user, or a combination thereof) for inspection based on any number of voltage contrast imaging metrics. In another embodiment, the components of the sample 108 are filtered according to one or more of the voltage contrast imaging metrics to generate the one or more target areas to be inspected.

In another embodiment, one or more target areas are determined according to the predicted VCI signal strength of the components of the sample 108. For example, target areas may be determined to include components with predicted high VCI signal strength and/or predicted low VCI signal strength. Accordingly, components with predicted medium-level signal strength may be excluded from target areas. In this regard, one or more target areas may be determined to have a high VCI signal contrast to facilitate defect detection and/or the identification of one or more root causes of detected defects.

In another embodiment, one or more target areas are determined to exclude components deemed too complex to be modeled (e.g. to provide a predicted VCI signal strength, or the like) reliably and/or accurately (e.g. within defined constraints, objectives, or the like). For example, the components of the sample 108 may be filtered based on a threshold value associated with a complexity metric such as, but not limited to, a number of layers present in a structure, a number of branches of a net, or a number of electrical components within a sub-circuit.

In another embodiment, one or more target areas are determined to exclude structures for which a predicted voltage signal strength is uncertain. For example, capacitive elements (e.g. fabricated capacitors, long interconnects, components with parasitic capacitance values, or the like) and/or circuits containing capacitive elements may be excluded from target areas to be inspected.

In another embodiment, one or more target areas are determined according to available resources. For example, a VCI inspection system (e.g. system 100, or the like) may contain finite computational resources including memory devices, data storage devices, database storage, or the like. Accordingly the number and/or size of target areas may be determined to remain within the limits of the inspection system.

In another embodiment, one or more target areas are determined to provide a desired level of inspection of a library of electrical components on the sample 108. For example, one or more target areas may be defined to include a desired number of electrical components (e.g. transistors, capacitors, resistors, or the like) of interest. In another embodiment, one or more target areas are determined to inspect components predicted to exhibit one or more defect mechanisms and/or fault mechanisms of interest.

In another embodiment, one or more target areas are determined according to one or more rules (e.g. one or more filter-based rules, one or more simulation-based rules, or the like). In this regard, one or more components may be filtered (e.g. into or out of a target area) according to rules based on multiple voltage contrast imaging metrics. As an illustrative example, a target area designed to include structures suitable for detecting electrical shorts may include pairs of components in which a first component exhibits a low resistance to ground (e.g. a grounded contact) in close proximity to a second component exhibiting a high resistance to ground. In this regard, nominal operation would result in the first component having a high VCI signal strength and the second component having a low signal strength, whereas an electrical short between the pair of components would result in both components having a high signal strength. However, if the first component is also electrically connected to a "leaky" component (e.g. a component with a predicted medium-level VCI signal strength such as, but not limited to, a diode or a capacitor), the VCI signal strength of the first component may be unpredictable or a medium-level value. Accordingly, one or more rules based on voltage contrast imaging metrics including physical layout, simulated VCI signal strengths, and electrical connectivity (e.g. based on netlist data) may be applied to refine the selection of components included in the one or more target areas. For example, one or more target areas may be determined based on a predicted fault mechanism (e.g. an electrical short between proximate structures) and further determined based on one or more rules associated with connectivity to "leaky" elements (e.g. elements such as, but not limited to, diodes or capacitors with a predicted medium-level VCI signal strength).

In another embodiment, each target area to be inspected may be determined according to a different set of voltage contrast imaging metrics. For example, a first subset of target areas may be designed to include structures with highly predictable VCI signal strengths, a second subset of target areas may be designed to include structures with medium-level predicted VCI signal strengths, a third subset of target areas may be designed to include structures predicted to exhibit one or more defect and/or fault mechanisms of interest, or the like. In this regard, multiple sets of target areas may be determined according to different diagnostic objectives (e.g. identification of a particular defect mechanism of interest, or the like).

In another embodiment, step 306 includes acquiring a voltage contrast imaging dataset for the one or more target areas on the sample (e.g. using the system 100, or the like). The voltage contrast imaging tool may be any voltage contrast imaging tool known in the art suitable for generating a voltage contrast image of a sample 108. In another embodiment, the acquisition conditions associated with the voltage contrast imaging tool (e.g. the energy of the particle beam, the scan speed of the particle beam, the pressure of an associated chamber containing the sample 108, or the like) are dynamically configurable according to the diagnostic objectives of the one or more target areas.

In another embodiment, step 308 includes detecting one or more defects based on the voltage contrast imaging dataset. For example, one or more defects may be detected based on a comparison of a measured voltage contrast imaging dataset (e.g. a VCI dataset acquired in step 306) to a reference dataset. The reference dataset may be any type of reference dataset known in the art such as, but not limited to, VCI data associated with a standard reference die (e.g. SRD defect detection), simulated VCI data (e.g. D2DB defect detection), or the like.

In another embodiment, simulated VCI data (e.g. a simulated VCI image) is automatically generated (e.g. by the controller 116 of system 100) based on the one or more target areas (e.g. the one or more target areas defined in step 304). Accordingly, simulated VCI data may not be generated for areas of the sample 108 not targeted for inspection. In this regard, the computational resources of the VCI inspection system (e.g. system 100, or the like) may be efficiently utilized to achieve high throughput. In another embodiment, one or more defects are detected in real-time (e.g. by a controller 116 receiving VCI signals from the detector 114). In this regard, the identification of a defect detection on a selected component is based on the signal received by the detector 114 associated with the selected component (e.g. based on a predetermined threshold value associated with a difference between a reference signal and a measured signal, or the like). In another embodiment, one or more defects are detected in a post-process (e.g. performed by the controller 116 of system 100, a remote controller, or the like). For example, one or more VCI signals of similar components (e.g. on the same die, different dies, different cells, different wafers, or the like) may be collected and aggregated (e.g. statistically processed to determine an average value, a median value, or the like). Further, the identification of a defect on a selected component may be determined based on the one or more collected VCI signals. Accordingly, the identification of one or more defects may be based on a probabilistic model which may be known in advance or developed in real-time (e.g. by the controller 116). In a further embodiment, one or more defects are detected in near real-time using an adaptive defect determination based on a continuously updating set of previously collected VCI signals. For example, VCI signals associated with similar classes of components may be continually aggregated to update the reference data utilized to identify defects. In this regard, VCI data and/or defect identification data of a first selected component is used to determine whether a defect is present on a second selected component on the sample 108.

In another embodiment, one or more defect mechanisms (e.g. electrical shorts, open circuits, voids, impurities, peeling, pattern defects, gate leakage effects, or the like) associated with identified defects are determined (e.g. by the controller 116). For example, one or more defect mechanisms may be associated with an identified defect based on voltage contrast imaging metrics (e.g. generated in step 302) for the identified defect.

In another embodiment, one or more probable fault mechanisms associated with one or more identified defects are determined. The one or more probable fault mechanisms may be determined based on any technique known in the art including, but not limited to fault modeling, fault injection, circuit simulation, or the like. For example, one or more fault mechanisms may be determined by modeling the impact of one or more defect mechanisms on an electrical circuit containing one or more identified defects and further simulating the impact of the modeled defect mechanisms. In this regard, defect mechanisms may be, but are not required to be, modeled as resistors (e.g. a degraded interconnect modeled as a resistor with a high resistance value, a short circuit modeled as a resistor with a low resistance value, or the like).

In another embodiment, the defect on a sample 108 may be determined and/or verified based on predicted defect and/or fault mechanisms. For example, a potential defect may be identified based on a received VCI signal from the sample 108 that is different than a reference VCI signal. Subsequently, one or more modified netlists (e.g. faulted netlists) may be generated (e.g. by the controller 116) to include defect mechanisms modeled as electrical components within the circuit (e.g. resistors, capacitors, or the like). Further, one or more simulated VCI datasets (e.g. simulated VCI images, or the like) may be generated based on the modeled defect mechanisms for comparison with the measured VCI dataset. In this regard, the simulated VCI datasets may facilitate detection of defects (e.g. by positively identifying a defect, by providing a relative probability of multiple probable defect mechanisms, or the like). Further, voltage contrast imaging metrics (e.g. associated with the physical layout of components, probable defect mechanisms associated with components, or the like), and/or the failure rate (e.g. a measured failure rate or a predicted failure rate based on predicted fault mechanisms associated with identified defects) may be utilized to weight the relative probability of the multiple probable defect mechanisms.

In another embodiment, inspection data may be generated by the VCI inspection tool (e.g. system 100, or the like). For example, inspection data may include, but is not limited to a summary pareto of defect mechanisms associated with the sample 108, or a sample plan (e.g. a simulated image of the sample 108) including locations of identified defects.

In another embodiment, inspection data from a first inspection round of the sample 108 may be provided as feedback to generate one or more additional inspection rounds of the sample 108. For example, inspection data including the locations of identified defects and/or defect mechanisms may be utilized to provide an updated set of target areas 202 for analysis. In another embodiment, inspection data may be provided as feed-forward data to one or more additional tools (e.g. one or more metrology tools, semiconductor process tools, electrical test tools, or the like) to refine and/or update one or more recipes based on the inspection data. In a further embodiment, one or more defects may be identified based on data provided by one or more additional tools (e.g. optical inspection tools, scanning electron microscopes, overlay measurement tools, metrology tools, or the like). For example, additional data (e.g. overlay data, critical dimension data, prior inspection data, or the like) associated with one or more components on the sample 108 may be utilized to weight the probabilities associated with the determination of one or more defects and/or one or more defect mechanisms on the sample 108. Further, system 100 may utilize inspection data as part of a feed-forward or a feedback loop according to any method known in the art. For example, the system may utilize machine learning (e.g. deep learning, neural networks, or the like) to facilitate the utilization of feed-forward or feedback loops. As another example, the system 100 may employ artificial intelligence to facilitate the implementation of feed-forward or feedback loops. Additionally, the system 100 may implement training (e.g. associated with user input, an automatically generated performance analysis, or the like) to dynamically adjust feed-forward or feedback loops.

Referring again to FIG. 1, in another embodiment, the inspection sub-system 106 includes one or more particle beam scanning elements. For example, the one or more particle beam scanning elements may include, but are not limited to, one or more scanning coils or deflectors suitable for controlling a position of the beam relative to the surface of the sample 108. In this regard, the one or more scanning elements may be utilized to scan the particle beam 104 across the sample 108 in a selected pattern. It is noted herein that the inspection sub-system 106 may operate in any scanning mode known in the art. For example, the inspection sub-system 106 may operate in a swathing mode when scanning a particle beam 104 across the surface of the sample 108. In this regard, the inspection sub-system 106 may scan a particle beam 104 across the sample 108, while the sample is moving, with the direction of scanning being nominally perpendicular to the direction of the sample motion. By way of another example, the inspection sub-system 106 may operate in a step-and-scan mode when scanning a particle beam 104 across the surface of the sample 108. In this regard, the inspection sub-system 106 may scan a particle beam 104 across the sample 108, which is nominally stationary when the beam 104 is being scanned.

In another embodiment, the sample 108 is disposed on a sample stage 112 suitable for securing the sample 108 during scanning. In another embodiment, the sample stage 112 is an actuatable stage. For example, the sample stage 112 may include, but is not limited to, one or more translational stages suitable for selectably translating the sample 108 along one or more linear directions (e.g., x-direction, y-direction and/or z-direction). By way of another example, the sample stage 112 may include, but is not limited to, one or more rotational stages suitable for selectably rotating the sample 108 along a rotational direction. By way of another example, the sample stage 112 may include, but is not limited to, a rotational stage and a translational stage suitable for selectably translating the sample along a linear direction and/or rotating the sample 108 along a rotational direction.

In another embodiment, the detector 114 includes a light detector (e.g. a photon detector). For example, the detector 114 may include a photomultiplier tube (PMT). Further, the detector 114 may consist of a phosphor anode, which is energized by the cascaded electrons of the PMT detector absorbed by the anode and subsequently emits light. In turn, the light detector may collect light emitted by the phosphor anode in order to image the sample 108. The light detector may include any light detector known in the art, such as, but not limited to, a CCD detector or a CCD-TDI detector. In a general sense, it is recognized herein that the detector 114 may include any device or combination of devices known in the art for characterizing a sample surface or bulk with a particle beam 104. For example, the detector 114 may include any particle detector known in the art configured to collect backscattered electrons, Auger electrons, transmitted electrons or photons (e.g., x-rays emitted by surface in response to incident electrons, cathodoluminescence of the sample 108, or the like).

It is noted herein that the set of electron optics of system 100 as described above and illustrated in FIG. 1 are provided merely for illustration and should not be interpreted as limiting. It is anticipated that a number of equivalent or additional configurations may be utilized within the scope of the present invention. By way of a non-limiting example, one or more electron lenses or apertures may be positioned within the system 100. By way of an additional non-limiting example, the system 100 may include, but is not limited to one or more electron deflectors, one or more apertures, one or more filters, or one or more stigmators.

In another embodiment, the controller 116 includes one or more processors 118. In another embodiment, the one or more processors 118 are configured to execute a set of program instructions maintained in a memory medium 120, or memory. The one or more processors 118 of a controller 116 may include any processing element known in the art. In this sense, the one or more processors 118 may include any microprocessor-type device configured to execute algorithms and/or instructions. In one embodiment, the one or more processors 118 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 120.

The memory medium 120 may include any storage medium known in the art suitable for storing program instructions executable by the associated one or more processors 118. For example, the memory medium 120 may include a non-transitory memory medium. As an additional example, the memory medium 120 may include, but is not limited to, a read-only memory, a random access memory, a magnetic or optical memory device (e.g., disk), a magnetic tape, a solid state drive and the like. It is further noted that memory medium 120 may be housed in a common controller housing with the one or more processors 118. In one embodiment, the memory medium 120 may be located remotely with respect to the physical location of the one or more processors 118 and controller 116. For instance, the one or more processors 118 of controller 116 may access a remote memory (e.g., server), accessible through a network (e.g., internet, intranet and the like). Therefore, the above description should not be interpreted as a limitation on the present invention but merely an illustration.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A voltage contrast imaging defect detection system, comprising:
    a voltage contrast imaging tool; and
    a controller coupled to the voltage contrast imaging tool, wherein the controller includes one or more processors, the one or more processors configured to execute program instructions configured to cause the one or more processors to:
    analyze design data associated with a sample to generate one or more voltage contrast imaging metrics for one or more structures on the sample;
    determine one or more target areas on the sample based on the one or more voltage contrast imaging metrics;
    direct the voltage contrast imaging tool to generate a voltage contrast imaging dataset limited to the one or more target areas on the sample;
    receive the voltage contrast imaging dataset for the one or more target areas on the sample from the voltage contrast imaging tool; and
    detect one or more defects based on the voltage contrast imaging dataset.

2. The voltage contrast imaging defect detection system of claim 1, wherein the one or more voltage contrast imaging metrics include a predicted signal strength of one or more voltage contrast images of the one or more structures.

3. The voltage contrast imaging defect detection system of claim 2, wherein the predicted signal strength of the one or more voltage contrast imaging signals comprises:
    a grayscale value of a grayscale voltage contrast image.

4. The voltage contrast imaging defect detection system of claim 1, wherein the one or more voltage contrast imaging metrics include a probability of detecting a defect on the one or more structures using voltage contrast imaging.

5. The voltage contrast imaging defect detection system of claim 1, wherein the one or more voltage contrast imaging metrics include a predicted defect mechanism associated with the one or more structures.

6. The voltage contrast imaging defect detection system of claim 1, wherein the one or more voltage contrast imaging metrics include a predicted fault mechanism associated with the one or more structures.

7. The voltage contrast imaging defect detection system of claim 1, wherein generating one or more voltage contrast imaging metrics for the one or more structures on a sample comprises:
    generating one or more voltage contrast imaging metrics based on a physical layout of the one or more structures.

8. The voltage contrast imaging defect detection system of claim 1, wherein generating one or more voltage contrast imaging metrics for the one or more structures on a sample comprises:
generating one or more voltage contrast imaging metrics based on a netlist including the one or more structures.

9. The voltage contrast imaging defect detection system of claim 8, wherein generating one or more voltage contrast imaging metrics based on a netlist including the one or more structures comprises:
identifying one or more sub-circuits associated with one or more nets of the netlist;
generating one or more voltage contrast imaging metrics based on the one or more sub-circuits.

10. The voltage contrast imaging defect detection system of claim 1, wherein generating one or more voltage contrast imaging metrics for the one or more structures on a sample comprises:
generating one or more voltage contrast imaging metrics based on one or more electrical properties of the one or more structures.

11. The voltage contrast imaging defect detection system of claim 10, wherein the electrical properties of the one or more structures comprise:
at least one of a resistance, an impedance, or a capacitance.

12. The voltage contrast imaging defect detection system of claim 1, wherein generating one or more voltage contrast imaging metrics for the one or more structures on a sample comprises:
generating one or more voltage contrast imaging metrics based on voltage contrast imaging conditions associated with the voltage contrast imaging tool.

13. The voltage contrast imaging defect detection system of claim 12, wherein the voltage contrast imaging conditions associated with the voltage contrast imaging tool include at least one of a resolution, a voltage of a scanning beam with respect to an electrical ground, a speed of the scanning beam, or a pressure of a chamber containing the one or more structures.

14. The voltage contrast imaging defect detection system of claim 1, wherein generating one or more voltage contrast imaging metrics for the one or more structures on a sample comprises:
generating one or more voltage contrast imaging metrics based on a simulation of one or more circuits associated with the one or more structures.

15. The voltage contrast imaging defect detection system of claim 14, wherein the simulation includes at least one of a numerical simulation or a rule-based simulation.

16. The voltage contrast imaging defect detection system of claim 1, wherein generating one or more voltage contrast imaging metrics for the one or more structures on a sample comprises:
generating one or more voltage contrast imaging metrics based on one or more intended electrical functions of the one or more structures.

17. The voltage contrast imaging defect detection system of claim 1, wherein the one or more structures include one or more structures within one or more layers on the sample.

18. The voltage contrast imaging defect detection system of claim 17, wherein the one or more layers include at least one of an insulator, a conductor, a semi-conductor, a well, or a substrate.

19. The voltage contrast imaging defect detection system of claim 17, wherein generating one or more voltage contrast imaging metrics for the one or more structures on a sample comprises:
generating one or more voltage contrast imaging metrics based on one or more characteristics of the one or more layers on the sample.

20. The voltage contrast imaging defect detection system of claim 19, wherein the one or more characteristics of the one or more layers on the sample include at least one of a conductivity or a band structure.

21. The voltage contrast imaging defect detection system of claim 17, wherein generating one or more voltage contrast imaging metrics for the one or more structures on a sample comprises:
generating one or more voltage contrast imaging metrics based on a connectivity relationship between the one or more layers on the sample.

22. The voltage contrast imaging defect detection system of claim 1, wherein determining one or more target areas on a sample comprises:
grouping the one or more structures based on the one or more voltage contrast imaging metrics.

23. The voltage contrast imaging defect detection system of claim 1, wherein determining one or more target areas on a sample comprises:
filtering the one or more structures based on the one or more voltage contrast imaging metrics.

24. The voltage contrast imaging defect detection system of claim 1, wherein determining one or more target areas on a sample comprises:
filtering the one or more structures based on a required acquisition time.

25. The voltage contrast imaging defect detection system of claim 1, wherein determining one or more target areas on a sample comprises:
filtering the one or more structures based on a threshold value of a predicted voltage contrast imaging signal.

26. The voltage contrast imaging defect detection system of claim 1, wherein determining one or more target areas on a sample comprises:
filtering the one or more structures based on a complexity of one or more sub-circuits including the one or more structures.

27. The voltage contrast imaging defect detection system of claim 1, wherein determining one or more target areas on a sample comprises:
filtering the one or more structures based on a proximity of the one or more structures to one or more neighboring structures.

28. The voltage contrast imaging defect detection system of claim 1, wherein determining one or more target areas on a sample comprises:
filtering the one or more structures based on a predicted fault type of the one or more structures.

29. The voltage contrast imaging defect detection system of claim 1, wherein determining one or more target areas on a sample comprises:
filtering the one or more structures based on a predicted defect mechanism of the one or more structures.

30. The voltage contrast imaging defect detection system of claim 1, wherein detecting one or more defects based on the voltage contrast imaging dataset comprises:
detecting one or more defects based on a critical area analysis.

31. The voltage contrast imaging defect detection system of claim 1, wherein detecting one or more defects based on the voltage contrast imaging dataset comprises:
   detecting one or more defects based on a fault modeling analysis.

32. The voltage contrast imaging defect detection system of claim 1, wherein the one or more processors are further configured to execute program instructions configured to cause the one or more processors to:
   generate a summary pareto of defect mechanisms associated with the one or more defects.

33. The voltage contrast imaging defect detection system of claim 1, wherein the one or more processors are further configured to execute program instructions configured to cause the one or more processors to:
   generate an additional voltage contrast imaging dataset for one or more additional target areas on the sample based on the one or more defects detected based on the voltage contrast imaging dataset;
   detect one or more additional defects based on the additional voltage contrast imaging dataset.

34. The voltage contrast imaging defect detection system of claim 1, wherein the one or more processors are further configured to execute program instructions configured to cause the one or more processors to:
   transmit data indicative of the one or more detected defects to update a voltage contrast defect detection system recipe.

35. A voltage contrast imaging defect detection apparatus, comprising:
   a particle beam source configured to generate one or more particle beams;
   one or more particle beam elements positioned to direct the one or more particle beams onto a sample;
   a detector positioned to receive one or more particles emanating from the sample; and
   a controller coupled to the detector, wherein the controller includes one or more processors, the one or more processors configured to execute program instructions configured to cause the one or more processors to:
      analyze design data associated with the sample to generate one or more voltage contrast imaging metrics for one or more structures on the sample;
      determine one or more target areas on the sample based on the one or more voltage contrast imaging metrics;
      generate a voltage contrast imaging dataset limited to the one or more target areas on the sample based on one or more particles emanating from the sample captured by the detector; and
      detect one or more defects based on the voltage contrast imaging dataset.

36. The voltage contrast imaging defect detection apparatus of claim 35, wherein the one or more particle beams comprise:
   at least one of an electron beam or an ion beam.

37. The voltage contrast imaging defect detection apparatus of claim 35, wherein the one or more particles emanating from the sample comprise:
   at least one of electrons, ions, or photons.

38. A voltage contrast imaging method, comprising:
   analyzing design data associated with a sample to generate one or more voltage contrast imaging metrics for one or more structures on a sample;
   determining one or more target areas on the sample based on the one or more voltage contrast imaging metrics;
   acquiring a voltage contrast imaging dataset limited to the one or more target areas on the sample; and
   detecting one or more defects based on the voltage contrast imaging dataset.

* * * * *